(12) United States Patent
Yan et al.

(10) Patent No.: US 11,862,060 B2
(45) Date of Patent: Jan. 2, 2024

(54) SHIFT REGISTER, GATE DRIVE CIRCUIT AND DISPLAY DEVICE

(71) Applicants: Beijing BOE Display Technology Co., Ltd., Beijing (CN); BOE Technology Group Co., Ltd., Beijing (CN)

(72) Inventors: Yan Yan, Beijing (CN); Xu Wang, Beijing (CN); Weitao Chen, Beijing (CN); Yu Ma, Beijing (CN); Zhiqiang Ma, Beijing (CN); Shunsha Lu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 3 days.

(21) Appl. No.: 17/770,415

(22) PCT Filed: Mar. 18, 2021

(86) PCT No.: PCT/CN2021/081477
§ 371 (c)(1),
(2) Date: Apr. 20, 2022

(87) PCT Pub. No.: WO2022/193215
PCT Pub. Date: Sep. 22, 2022

(65) Prior Publication Data
US 2023/0245609 A1    Aug. 3, 2023

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01); *G09G 2320/02* (2013.01)

(58) Field of Classification Search
None
See application file for complete search history.

(56) References Cited

U.S. PATENT DOCUMENTS

2019/0129562 A1* 5/2019 Li ........................ G09G 3/3677
2019/0371422 A1* 12/2019 Wang ................... G09G 3/3674

* cited by examiner

*Primary Examiner* — Stephen T. Reed
(74) *Attorney, Agent, or Firm* — IPro, PLLC

(57) ABSTRACT

A shift register, a gate drive circuit and a display device. During forward scanning, the first input circuit supplies a signal of a first reference signal terminal to a first node in response to a signal of a first input signal terminal at an input phase, and the second input circuit supplies a signal of a second reference signal terminal to the first node in response to a signal of a second input signal terminal at a reset phase; and during reverse scanning, the second input circuit supplies the signal of the second reference signal terminal to the first node in response to the signal of the second input signal terminal at the input phase, and the first input circuit supplies the signal of the first reference signal terminal to the first node in response to the signal of the first input signal terminal at the reset phase.

15 Claims, 9 Drawing Sheets

SHIFT REGISTER, GATE DRIVE CIRCUIT AND DISPLAY DEVICE

CROSS-REFERENCE TO RELATED APPLICATIONS

The present application is a US National Stage of International Application No. PCT/CN2021/081477, filed on Mar. 18, 2021, of which the entire contents are incorporated herein by reference.

FIELD

The present disclosure relates to the field of display, and in particular to a shift register, a gate drive circuit and a display device.

BACKGROUND

Rapid development of the display technology promotes integration density increase and cost decrease of display devices. The gate driver on array (GOA) technology integrates a thin film transistor (TFT) gate drive circuit on an array substrate of a display device to form scanning drive for the display device. The gate drive circuit is usually composed of a plurality of cascaded shift registers.

SUMMARY

An embodiment of the present disclosure provides a shift register. The shift register includes:
  a first input circuit configured to supply a signal of a first reference signal terminal to a first node in response to a signal of a first input signal terminal;
  a second input circuit configured to supply a signal of a second reference signal terminal to the first node in response to a signal of a second input signal terminal;
  a control circuit configured to control a signal of the first node and a signal of a second node; and
  an output circuit configured to supply a signal of a clock signal terminal to a drive output terminal in response to the signal of the first node, and to supply a signal of a third reference signal terminal to the drive output terminal in response to the signal of the second node;
  where one of the first input signal terminal and the second input signal terminal is loaded with an effective signal at an input phase, and the other of the first input signal terminal and the second input signal terminal is loaded with an effective signal at a reset phase.

According to a possible implementation, in the shift register provided in an embodiment of the present disclosure, the second node includes: a first sub-node and a second sub-node;
  the control circuit includes a first sub-control circuit and a second sub-control circuit; the first sub-control circuit is configured to control the signal of the first node and a signal of the first sub-node; and the second sub-control circuit is configured to control the signal of the first node and a signal of the second sub-node; and
  the output circuit is configured to supply the signal of the third reference signal terminal to the drive output terminal in response to the signal of the first sub-node, and to supply the signal of the third reference signal terminal to the drive output terminal in response to the signal of the second sub-node.

According to a possible implementation, in the shift register provided in an embodiment of the present disclosure, the first sub-control circuit includes: a first transistor, a second transistor, a third transistor, a fourth transistor and a fifth transistor;
  a gate and a first electrode of the first transistor are both electrically connected to a first control terminal, and a second electrode of the first transistor is electrically connected to a gate of the second transistor;
  a first electrode of the second transistor is electrically connected to the first control terminal, and a second electrode of the second transistor is electrically connected to the first sub-node;
  a gate of the third transistor is electrically connected to the first node, a first electrode of the third transistor is electrically connected to the third reference signal terminal, and a second electrode of the third transistor is electrically connected to the first sub-node;
  a gate of the fourth transistor is electrically connected to the first node, a first electrode of the fourth transistor is electrically connected to the third reference signal terminal, and a second electrode of the fourth transistor is electrically connected to the gate of the second transistor; and
  a gate of the fifth transistor is electrically connected to the first sub-node, a first electrode of the fifth transistor is electrically connected to the third reference signal terminal, and a second electrode of the fifth transistor is electrically connected to the first node.

According to a possible implementation, in the shift register provided in an embodiment of the present disclosure, the first sub-control circuit further includes: a sixth transistor and a seventh transistor;
  a gate of the sixth transistor is electrically connected to the first input signal terminal, a first electrode of the sixth transistor is electrically connected to the third reference signal terminal, and a second electrode of the sixth transistor is electrically connected to the first sub-node; and
  a gate of the seventh transistor is electrically connected to the second input signal terminal, a first electrode of the seventh transistor is electrically connected to the third reference signal terminal, and a second electrode of the seventh transistor is electrically connected to the first sub-node.

According to a possible implementation, in the shift register provided in an embodiment of the present disclosure, the second sub-control circuit includes: an eighth transistor, a ninth transistor, a tenth transistor, an eleventh transistor and a twelfth transistor;
  a gate and a first electrode of the eighth transistor are both electrically connected to a second control terminal, and a second electrode of the eighth transistor is electrically connected to a gate of the ninth transistor;
  a first electrode of the ninth transistor is electrically connected to the second control terminal, and a second electrode of the ninth transistor is electrically connected to the second sub-node;
  a gate of the tenth transistor is electrically connected to the first node, a first electrode of the tenth transistor is electrically connected to the third reference signal terminal, and a second electrode of the tenth transistor is electrically connected to the second sub-node;
  a gate of the eleventh transistor is electrically connected to the first node, a first electrode of the eleventh transistor is electrically connected to the third reference signal terminal, and a second electrode of the eleventh transistor is electrically connected to the gate of the ninth transistor; and a gate of the twelfth transistor is electrically connected to the second sub-node, a first electrode of the twelfth transistor is electrically connected to the third reference signal terminal, and a second electrode of the twelfth transistor is electrically connected to the first node.

According to a possible implementation, in the shift register provided in an embodiment of the present disclosure, the second sub-control circuit further includes: a thirteenth transistor and a fourteenth transistor;

a gate of the thirteenth transistor is electrically connected to the first input signal terminal, a first electrode of the thirteenth transistor is electrically connected to the third reference signal terminal, and a second electrode of the thirteenth transistor is electrically connected to the second sub-node; and a gate of the fourteenth transistor is electrically connected to the second input signal terminal, a first electrode of the fourteenth transistor is electrically connected to the third reference signal terminal, and a second electrode of the fourteenth transistor is electrically connected to the second sub-node.

According to a possible implementation, in the shift register provided in an embodiment of the present disclosure, the output circuit includes: a storage capacitor, a fifteenth transistor, a sixteenth transistor and a seventeenth transistor;

a gate of the fifteenth transistor is electrically connected to the first node, a first electrode of the fifteenth transistor is electrically connected to the clock signal terminal, and a second electrode of the fifteenth transistor is electrically connected to the drive output terminal;

a gate of the sixteenth transistor is electrically connected to the first sub-node, a first electrode of the sixteenth transistor is electrically connected to the third reference signal terminal, and a second electrode of the sixteenth transistor is electrically connected to the drive output terminal;

a gate of the seventeenth transistor is electrically connected to the second sub-node, a first electrode of the seventeenth transistor is electrically connected to the third reference signal terminal, and a second electrode of the seventeenth transistor is electrically connected to the drive output terminal; and a first electrode plate of the storage capacitor is electrically connected to the first node, and a second electrode plate of the storage capacitor is electrically connected to the drive output terminal.

According to a possible implementation, in the shift register provided in an embodiment of the present disclosure, the first input circuit includes an eighteenth transistor; and a gate of the eighteenth transistor is electrically connected to the first input signal terminal, a first electrode of the eighteenth transistor is electrically connected to the first reference signal terminal, and a second electrode of the eighteenth transistor is electrically connected to the first node.

According to a possible implementation, in the shift register provided in an embodiment of the present disclosure, the second input circuit includes: a nineteenth transistor; and a gate of the nineteenth transistor is electrically connected to the second input signal terminal, a first electrode of the nineteenth transistor is electrically connected to the second reference signal terminal, and a second electrode of the nineteenth transistor is electrically connected to the first node.

According to a possible implementation, in the shift register provided in an embodiment of the present disclosure, the shift register further includes: a twentieth transistor; and a gate of the twentieth transistor is electrically connected to a first frame reset signal terminal, a first electrode of the twentieth transistor is electrically connected to the third reference signal terminal, and a second electrode of the twentieth transistor is electrically connected to the first node.

According to a possible implementation, in the shift register provided in an embodiment of the present disclosure, the shift register further includes: a twenty-first transistor; where a gate of the twenty-first transistor is electrically connected to a second frame reset signal terminal, a first electrode of the twenty-first transistor is electrically connected to the third reference signal terminal, and a second electrode of the twenty-first transistor is electrically connected to the drive output terminal.

In another aspect, an embodiment of the present disclosure further provides a gate drive circuit, which includes a plurality of cascaded shift registers provided in the embodiment of the present disclosure;

the first input signal terminal of a first stage of shift register is electrically connected to a first frame trigger signal terminal, and the second input signal terminal of a last stage of shift register is electrically connected to a second frame trigger signal terminal; and in every two stages of shift registers, the first input signal terminal of a next stage of shift register is electrically connected to the drive output terminal of a previous stage of shift register, and the second input signal terminal of the previous stage of shift register is electrically connected to the drive output terminal of the next stage of shift register.

In another aspect, an embodiment of the present disclosure further provides a display device, which includes the gate drive circuit provided in the embodiment of the present disclosure.

According to a possible implementation, in the display device provided in an embodiment of the present disclosure, the display device further includes: a first reference signal line, a second reference signal line and a third reference signal line which are arranged in a mutually spaced manner; a first reference terminal electrically connected to the first reference signal line; a second reference terminal electrically connected to the second reference signal line; and a third reference terminal electrically connected to the third reference signal line;

where a first reference signal terminal of a shift register in the gate drive circuit is electrically connected to the first reference signal line;

a second reference signal terminal of a shift register in the gate drive circuit is electrically connected to the second reference signal line; and a third reference signal terminal of a shift register in the gate drive circuit is electrically connected to the third reference signal line.

According to a possible implementation, in the display device provided in an embodiment of the present disclosure, the display device further includes: a driver chip;

where the driver chip is bonded to the first reference terminal, the second reference terminal and the third reference terminal separately; and the driver chip is configured to load a signal into the first reference signal terminal of the shift register in the gate drive circuit through the first reference terminal, to load a signal into the second reference signal terminal of the shift register in the gate drive circuit through the second reference terminal and to load a signal into the third reference signal terminal of the shift register in the gate drive circuit through the third reference terminal.

DETAILED DESCRIPTION OF THE EMBODIMENTS

Figure 1:
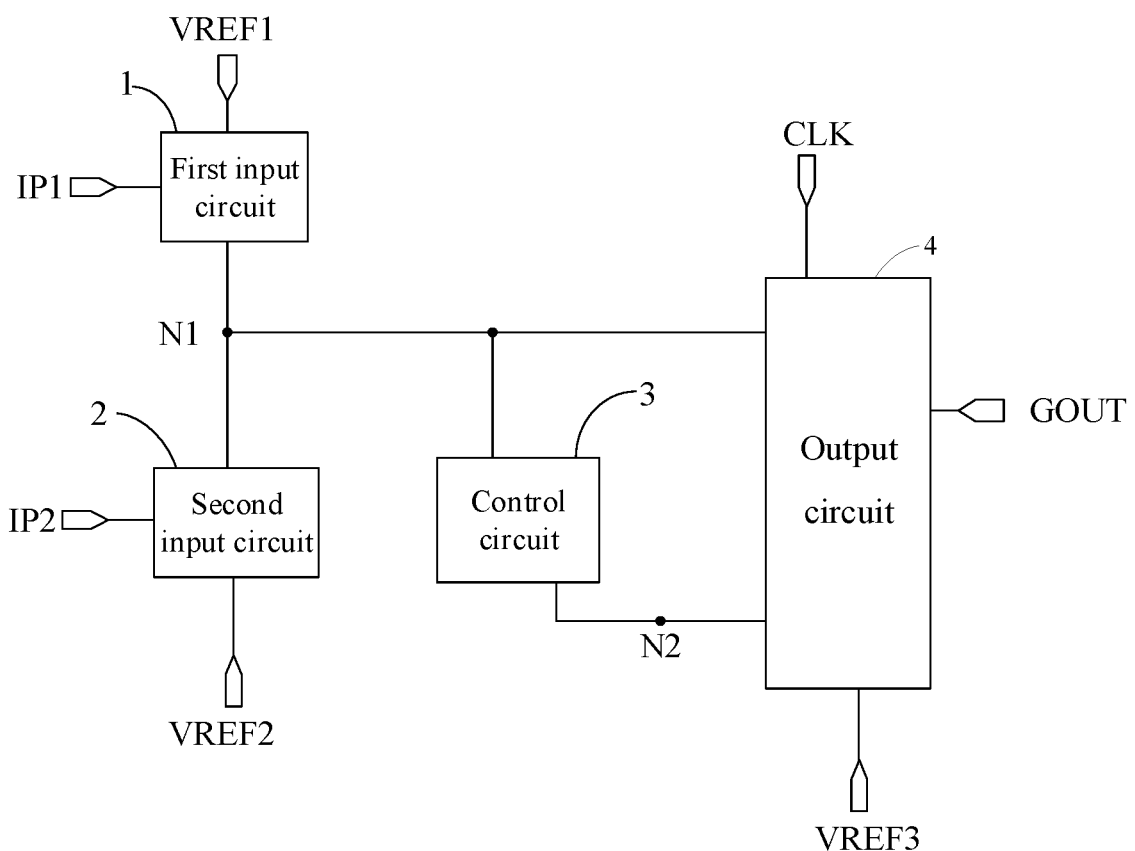
FIG. 1 is some structural schematic diagram of a shift register provided in embodiments of the present disclosure.

For making the objectives, technical solutions and advantages of embodiments of the present disclosure more obvious, the technical solutions of the embodiments of the present disclosure will be clearly and completely described below in conjunction with the accompanying drawings in the embodiments of the present disclosure. Apparently, the embodiments described are some rather than all of the embodiments of the present disclosure. The embodiments in the present disclosure and features of the embodiments may be combined with each other without conflict. Based on the embodiments of the present disclosure, all other embodiments acquired by those of ordinary skill in the art without making creative efforts fall within the scope of protection of the present disclosure.

Unless otherwise defined, technical or scientific terms used in the present disclosure should have ordinary meanings as understood by those of ordinary skill in the art to which the present disclosure belongs. The "first", "second" and similar words used in the present disclosure do not indicate any order, amount or importance, but are only used to distinguish different components. "Including", "comprising" or other similar words indicate that the elements or objects before the word include elements or objects after the word and their equivalents, without excluding other elements or objects. "Connected", "connected" or other similar words are not limited to physical or mechanical connections, but can include electrical connections, which may be direct or indirect.

It should be noted that a size and a shape of each figure in the drawings do not reflect a true scale, but only for illustrating the present disclosure. Throughout the drawings, identical or similar reference numerals denote identical or similar elements or elements having identical or similar functions.

An embodiment of the present disclosure provides a shift register, as shown in FIG. 1 and including: a first input circuit 1, a second input circuit 2, a control circuit 3 and an output circuit 4;

the first input circuit 1 is configured to supply a signal of a first reference signal terminal VREF1 to a first node N1 in response to a signal of a first input signal terminal IP1;

the second input circuit 2 is configured to supply a signal of a second reference signal terminal VREF2 to the first node N1 in response to a signal of a second input signal terminal IP2;

the control circuit 3 is configured to control a signal of the first node N1 and a signal of a second node N2;

the output circuit 4 is configured to supply a signal of a clock signal terminal CLK to a drive output terminal GOUT in response to the signal of the first node N1, and to supply a signal of a third reference signal terminal VREF3 to the drive output terminal GOUT in response to the signal of the second node N2; and one of the first input signal terminal IP1 and the second input signal terminal IP2 is loaded with an effective signal at an input phase, and the other of the first input signal terminal and the second input signal terminal is loaded with an effective signal at a reset phase.

An internal structure of the shift register provided in the embodiments of the present disclosure is adjusted, the first input circuit 1 and the second input circuit 2 are designed in a symmetrical structure, and charge and discharge of the first node N1 may be designed symmetrically during forward and reverse scanning, thereby realizing a function of bidirectional scanning.

For example, during forward scanning, the first input circuit 1 may serve as a signal input circuit, and the corresponding first input signal terminal IP1 is loaded with an effective signal at the input phase, that is, the first input signal terminal IP1 receives a signal output by the drive output terminal GOUT of a previous row of shift register, and after the first input circuit 1 is turned on, the signal of the first reference signal terminal VREF1 is supplied to the first node N1 for charging. Correspondingly, the second input circuit 2 may serve as a signal reset circuit, and the corresponding second input signal terminal IP2 is loaded with an effective signal at the reset phase, that is, the second input signal terminal IP2 receives a signal output by the drive output terminal GOUT of a next row of shift register, and when the next row of shift register outputs an effective signal, after the second input circuit 2 is turned on, the second reference signal terminal VREF2 conducts discharge on the first node N1.

On the contrary, during reverse scanning, the second input circuit 2 may serve as a signal input circuit, and the corresponding second input signal terminal IP2 is loaded with an effective signal at the input phase, that is, the second input signal terminal IP2 receives a signal output by the drive output terminal GOUT of a next row of shift register, and after the second input circuit 2 is turned on, the signal of the second reference signal terminal VREF2 is supplied to the first node N1 for charging. Correspondingly, the first input circuit 1 may serve as a signal reset circuit, and the corresponding first input signal terminal IP1 is loaded with an effective signal at the reset phase, that is, the first input signal terminal IP1 receives a signal output by the drive output terminal GOUT of a previous row of shift register, and when the previous row of shift register outputs an effective signal, after the first input circuit 1 is turned on, the first reference signal terminal VREF1 conducts discharge on the first node N1.

For example, during forward scanning, the first reference signal terminal VREF1 may be loaded with a high level signal, and the second reference signal terminal VREF2 may be loaded with a low level signal; and during reverse scanning, the first reference signal terminal VREF1 may be loaded with a low level signal, and the second reference signal terminal VREF2 may be loaded with a high level signal.

Specifically, a structural design of the shift register provided in the embodiments of the present disclosure ensures symmetry of forward and reverse scanning; and compared with a circuit structure of a traditional one-way scanning shift register, there is no obvious difference in duty cycles of thin film transistors (TFTs) inside the circuit structure and charge and discharge of various important nodes, thereby ensuring reliability and stability of the circuit structure.

Figure 2:
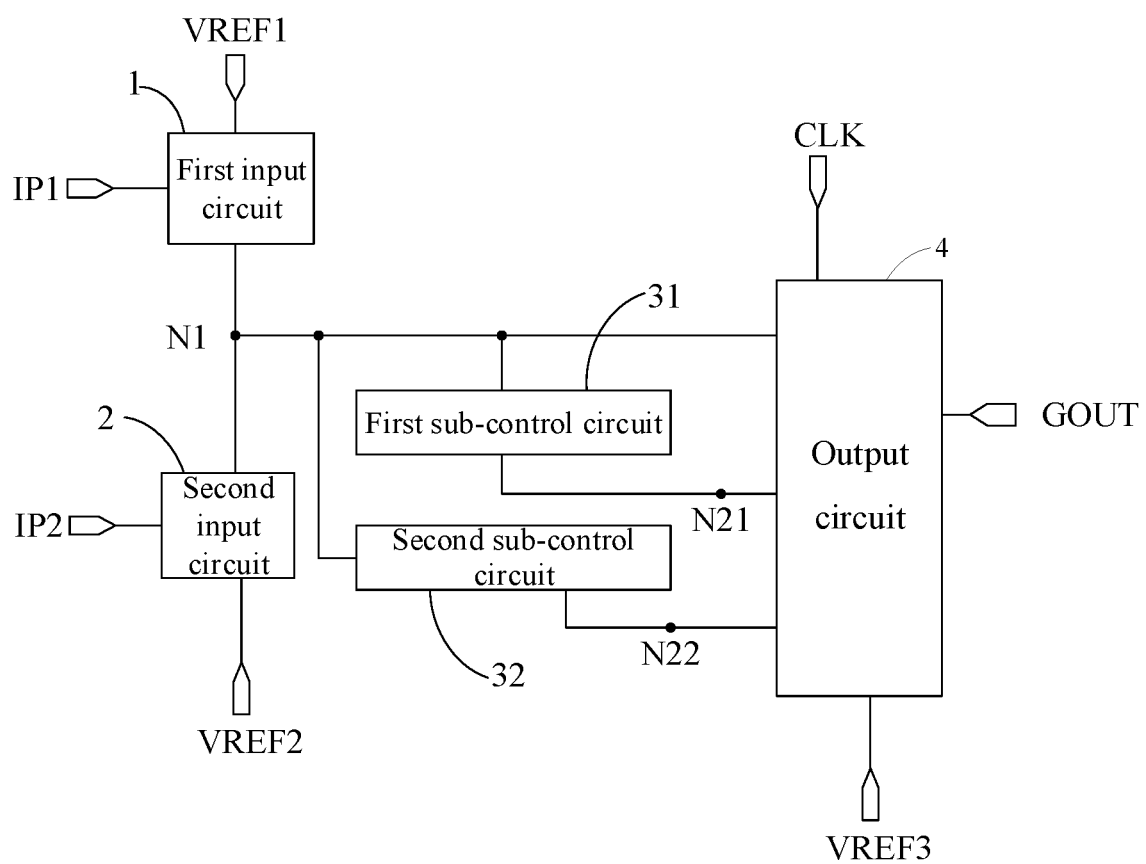
FIG. 2 is some other structural schematic diagram of the shift register provided in the embodiments of the present disclosure.

During specific implementation, in an embodiment of the present disclosure, as shown in FIG. 2, the second node N2 may include: a first sub-node N21 and a second sub-node N22. The control circuit 3 includes a first sub-control circuit 31 and a second sub-control circuit 32, where the first sub-control circuit 31 is configured to control the signal of the first node N1 and the signal of the first sub-node N21; and the second sub-control circuit 32 is configured to control the signal of the first node N1 and the signal of the second sub-node N22. The output circuit 4 is configured to supply the signal of the third reference signal terminal VREF3 to the drive output terminal GOUT in response to the signal of the first sub-node N21 and to supply the signal of the third reference signal terminal VREF3 to the drive output terminal GOUT in response to the signal of the second sub-node N22.

Figure 3:
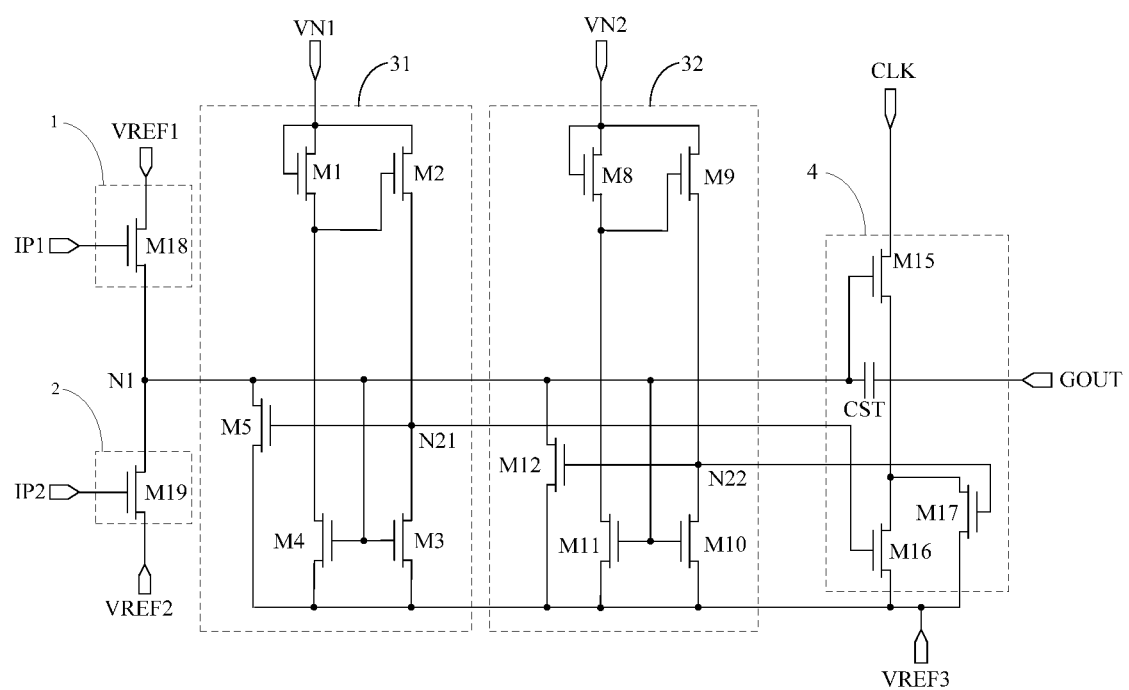
FIG. 3 is some specific structural schematic diagram of the shift register provided in the embodiments of the present disclosure.

During specific implementation, in the embodiment of the present disclosure, as shown in FIG. 3, the first sub-control circuit 31 may include: a first transistor M1, a second transistor M2, a third transistor M3, a fourth transistor M4 and a fifth transistor M5;
- a gate and a first electrode of the first transistor M1 are both electrically connected to a first control terminal VN1, and a second electrode of the first transistor M1 is electrically connected to a gate of the second transistor M2;
- a first electrode of the second transistor M2 is electrically connected to the first control terminal VN1, and a second electrode of the second transistor M2 is electrically connected to the first sub-node N21;
- a gate of the third transistor M3 is electrically connected to the first node N1, a first electrode of the third transistor M3 is electrically connected to the third reference signal terminal VREF3, and a second electrode of the third transistor M3 is electrically connected to the first sub-node N21;
- a gate of the fourth transistor M4 is electrically connected to the first node N1, a first electrode of the fourth transistor M4 is electrically connected to the third reference signal terminal VREF3, and a second electrode of the fourth transistor M4 is electrically connected to the gate of the second transistor M2; and
- a gate of the fifth transistor M5 is electrically connected to the first sub-node N21, a first electrode of the fifth transistor M5 is electrically connected to the third reference signal terminal VREF3, and a second electrode of the fifth transistor M5 is electrically connected to the first node N1.

During specific implementation, in the embodiment of the present disclosure, as shown in FIG. 3, the second sub-control circuit 32 may include: an eighth transistor M8, a ninth transistor M9, a tenth transistor M10, an eleventh transistor M11 and a twelfth transistor M12;
- a gate and a first electrode of the eighth transistor M8 are both electrically connected to a second control terminal VN2, and a second electrode of the eighth transistor M8 is electrically connected to a gate of the ninth transistor M9;
- a first electrode of the ninth transistor M9 is electrically connected to the second control terminal VN2, and a second electrode of the ninth transistor M9 is electrically connected to the second sub-node N22;
- a gate of the tenth transistor M10 is electrically connected to the first node N1, a first electrode of the tenth transistor M10 is electrically connected to the third reference signal terminal VREF3, and a second electrode of the tenth transistor M10 is electrically connected to the second sub-node N22;
- a gate of the eleventh transistor M11 is electrically connected to the first node N1, a first electrode of the eleventh transistor M11 is electrically connected to the third reference signal terminal VREF3, and a second electrode of the eleventh transistor M11 is electrically connected to the gate of the ninth transistor M9; and
- a gate of the twelfth transistor M12 is electrically connected to the second sub-node N22, a first electrode of the twelfth transistor M12 is electrically connected to the third reference signal terminal VREF3, and a second electrode of the twelfth transistor M12 is electrically connected to the first node N1.

During specific implementation, in the embodiment of the present disclosure, as shown in FIG. 3, the output circuit 4 may include: a storage capacitor CST, a fifteenth transistor M15, a sixteenth transistor M16 and a seventeenth transistor M17;
- a gate of the fifteenth transistor M15 is electrically connected to the first node N1, a first electrode of the fifteenth transistor M15 is electrically connected to the clock signal terminal CLK, and a second electrode of the fifteenth transistor M15 is electrically connected to the drive output terminal GOUT;
- a gate of the sixteenth transistor M16 is electrically connected to the first sub-node N21, a first electrode of the sixteenth transistor M16 is electrically connected to the third reference signal terminal VREF3, and a second electrode of the sixteenth transistor M16 is electrically connected to the drive output terminal GOUT;
- a gate of the seventeenth transistor M17 is electrically connected to the second sub-node N22, a first electrode of the seventeenth transistor M17 is electrically connected to the third reference signal terminal VREF3, and a second electrode of the seventeenth transistor M17 is electrically connected to the drive output terminal GOUT; and
- a first electrode plate of the storage capacitor CST is electrically connected to the first node N1, and a second electrode plate of the storage capacitor CST is electrically connected to the drive output terminal GOUT.

During specific implementation, in the embodiment of the present disclosure, as shown in FIG. 3, the first input circuit 1 may include: an eighteenth transistor M18; and a gate of the eighteenth transistor M18 is electrically connected to the first input signal terminal IP1, a first electrode of the eighteenth transistor M18 is electrically connected to the first reference signal terminal VREF1, and a second electrode of the eighteenth transistor M18 is electrically connected to the first node N1.

During specific implementation, in the embodiment of the present disclosure, as shown in FIG. 3, the second input circuit 2 may include: a nineteenth transistor M19; and a gate of the nineteenth transistor M19 is electrically connected to the second input signal terminal IP2, a first electrode of the nineteenth transistor M19 is electrically connected to the second reference signal terminal VREF2, and a second electrode of the nineteenth transistor M19 is electrically connected to the first node N1.

To reduce a preparation process, all transistors may be N-type transistors during specific implementation as shown in FIG. 3. During forward scanning, the signal of the first reference signal terminal VREF1 may be a high level signal, and the signal of the second reference signal terminal VREF2 may be a low level signal; and during reverse scanning, the signal of the first reference signal terminal VREF1 may be a low level signal, the signal of the second reference signal terminal VREF2 may be a high level signal, and the signal of the third reference signal terminal VREF3 is always a low level signal. Of course, all transistors may also be P-type transistors during specific implementation, which is not limited herein.

Figure 4:
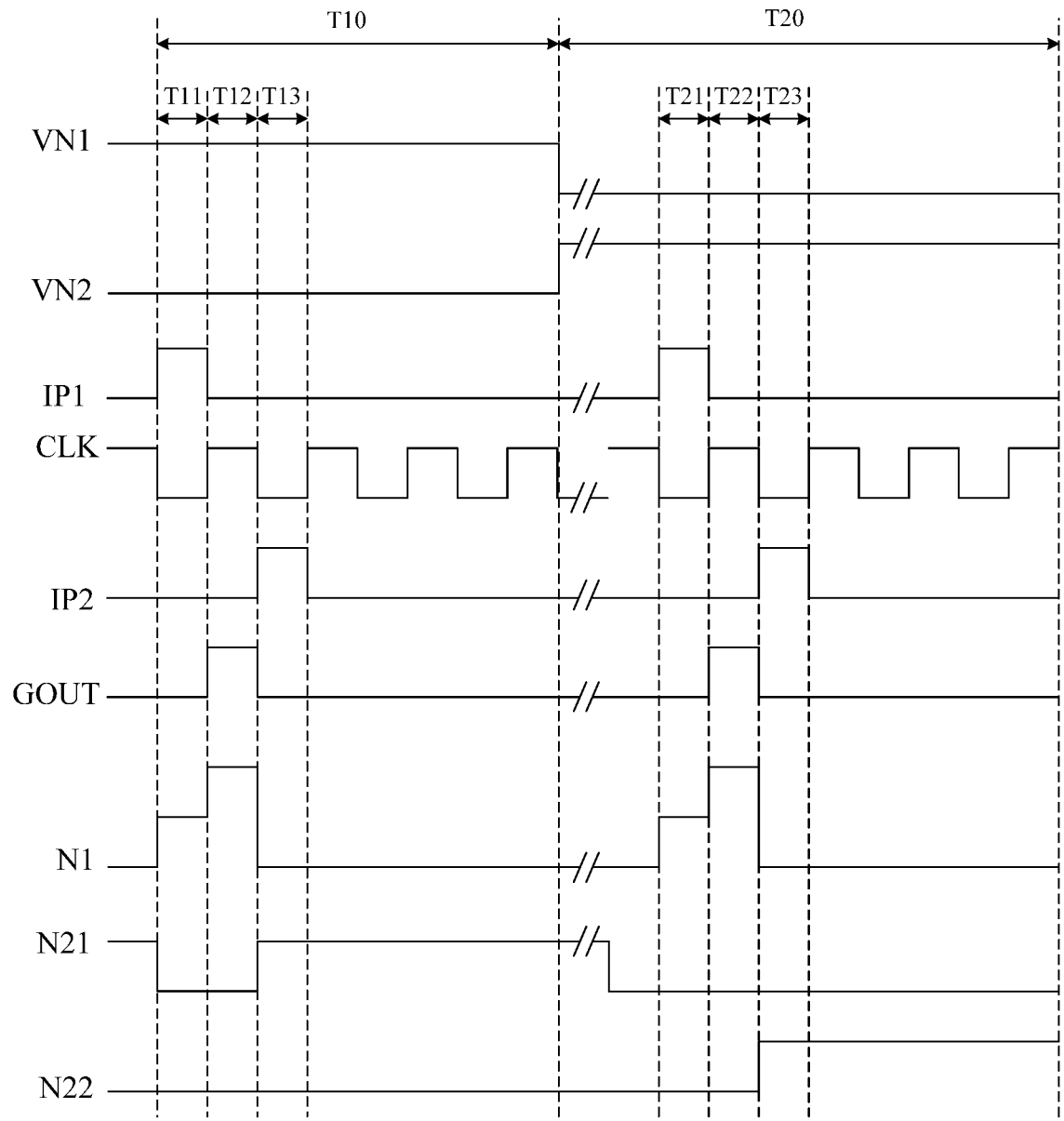
FIG. 4 is some signal sequence diagram provided in the embodiments of the present disclosure.

During specific implementation, a signal of the first control terminal VN1 may be a pulse signal with a high level and a low level switched, a signal of the second control terminal VN2 may be a pulse signal with a high level and a low level switched, and a level of the first control terminal VN1 is opposite to that of the second control terminal VN2. For example, as shown in FIG. 4, at a phase T10, the first control terminal VN1 is configured with a high level signal, and the second control terminal VN2 is configured with a low level signal. At a phase T20, the first control terminal VN1 is configured with a low level, and the second control terminal VN2 is configured with a high level signal. For example, a duration of the phase T10 may be consistent with that of the phase T20. For example, the duration of the phase T10 and the duration of the phase T20 are set as a duration of one display frame, a duration of a plurality of display frames, 2 s, 1 h, 24 h, etc. respectively, which are not limited herein.

During specific implementation, the signal of the first control terminal VN1 and the signal of the second control terminal VN2 may also be direct current signals respectively. When the first control terminal VN1 is loaded with a direct current signal with a high level, the second control terminal VN2 is loaded with no signal or a direct current signal with a low level. When the second control terminal is loaded with a direct current signal with a high level, the first control terminal VN1 is loaded with no signal or a direct current signal with a low level. For example, at the phase T10, the first control terminal VN1 is configured with a direct current signal with a high level, and the second control terminal VN2 is configured with a direct current signal with a low level. At the phase T20, the first control terminal VN1 is configured with a direct current signal with a low level, and the second control terminal VN2 is configured with a direct current signal with a high level. For example, the duration of the T10 phase may be consistent with that of the phase T20. For example, the duration of the phase T10 and the duration of the phase T20 are set as a duration of one display frame, a duration of a plurality of display frames, 2 s, 1 h, 24 h, etc. respectively, which are not limited herein.

A sequence of the phase T10 and the phase T20 may be determined according to actual application. For example, a work process in the phase T10 may be executed, and further a work process in the phase T20 may be executed. Alternatively, the work process in the phase T20 may be executed, and further the work process in the phase T10 may be executed.

A structure of the shift register shown in FIG. 3 is taken as an example below, a signal sequence diagram shown in FIG. 4 is combined, forward scanning is taken as an example, and the work process of the shift register provided in the embodiments of the present disclosure will be described in detail. In the following description, 1 represents a high level signal and 0 represents a low level signal, where 1 and 0 represent logic levels of signals, only for better explaining a work process of the shift register provided in the embodiments of the present disclosure, rather than a potential applied to a gate of each transistor during specific implementation.

The phases T10 and T20 in the signal sequence diagram shown in FIG. 4 are selected. An input phase T11, a reset phase T12 and an output phase T13 in the phase T10 are selected. An input phase T21, a reset phase T22 and an output phase T23 in the phase T20 are selected.

At the phase T10, the second control terminal VN2 is configured with a low level signal, so the eighth transistor M8 is cut off.

At the input phase T11, IP1=1, CLK=0 and IP2=0.

Since IP2=0, the nineteenth transistor M19 is cut off. Since IP1=1, the eighteenth transistor M18 is turned on, so as to supply the high level signal of the first reference signal terminal VREF1 to the first node N1, and further the first node N1 is configured with a high level signal, so that the third transistor M3, the fourth transistor M4, the tenth transistor M10, the eleventh transistor M11 and the fifteenth transistor M15 are all controlled to be turned on. The turned-on fourth transistor M4 may supply a low level signal of the third reference signal terminal VREF3 to the gate of the second transistor M2, so as to control the second transistor M2 to be cut off. The turned-on third transistor M3 may supply the low level signal of the third reference signal terminal VREF3 to the first sub-node N21, and further the first sub-node N21 is configured with a low level signal, so that the fifth transistor M5 and the sixteenth transistor M16 are both controlled to be cut off. The turned-on eleventh transistor M11 may supply the low level signal of the third reference signal terminal VREF3 to the gate of the ninth transistor M9, so as to control the ninth transistor M9 to be cut off. The turned-on tenth transistor M10 may supply the low level signal of the third reference signal terminal VREF3 to the second sub-node N22, and further the second sub-node N22 is configured with a low level signal, so that the twelfth transistor M12 and the seventeenth transistor M17 are both controlled to be cut off. The turned-on fifteenth transistor M15 may supply the low level signal of the clock signal terminal CLK to a drive output terminal GOUT, so that the drive output terminal GOUT outputs a low level signal.

At the output phase T12, IP1=0, CLK=1 and IP2=0.

Since IP2=0, the nineteenth transistor M19 is cut off. Since IP1=0, the eighteenth transistor M18 is cut off Therefore, the first node N1 is in a floating state. The storage capacitor may enable the first node N1 to maintain a high level signal. The first node N1 is configured with a high level signal, so the third transistor M3, the fourth transistor M4, the tenth transistor M10, the eleventh transistor M11 and the fifteenth transistor M15 are all controlled to be turned on. The turned-on fourth transistor M4 may supply a low level signal of the third reference signal terminal VREF3 to the gate of the second transistor M2, so as to control the second transistor M2 to be cut off. The turned-on third transistor M3 may supply the low level signal of the third reference signal terminal VREF3 to the first sub-node N21, and further the first sub-node N21 is configured with a low level signal, so that the fifth transistor M5 and the sixteenth transistor M16 are both controlled to be cut off. The turned-on eleventh transistor M11 may supply the low level signal of the third reference signal terminal VREF3 to the gate of the ninth transistor M9, so as to control the ninth transistor M9 to be cut off. The turned-on tenth transistor M10 may supply the low level signal of the third reference signal terminal VREF3 to the second sub-node N22, and further the second sub-node N22 is configured with a low level signal, so that the twelfth transistor M12 and the seventeenth transistor M17 are both controlled to be cut off.

The turned-on fifteenth transistor M15 may supply a high level signal of the clock signal terminal CLK to the drive output terminal GOUT. Since the first node N1 is in a floating state, the storage capacitor further pulls up a potential of the first node N1, and further the fifteenth transistor M15 may be turned on as thoroughly as possible, so that the high level signal of the clock signal terminal CLK may be supplied to the drive output terminal GOUT without voltage loss as much as possible, and the drive output terminal GOUT outputs a high level signal.

At the reset phase T13, IP1=0, CLK=0 and IP2=1.

Since IP1=0, the eighteenth transistor M18 is cut off. Since IP2=1, the nineteenth transistor M19 is turned on, so as to supply the low level signal of the second reference signal terminal VREF2 to the first node N1, and further the first node N1 is configured with a low level signal, so that the third transistor M3, the fourth transistor M4, the tenth transistor M10, the eleventh transistor M11 and the fifteenth transistor M15 are all controlled to be cut off. The second sub-node N22 maintains a low level signal, so that the twelfth transistor M12 and the seventeenth transistor M17 are both controlled to be cut off.

The first transistor M1 is turned on under control of a high level signal of the first control terminal VN1, so as to supply the high level signal of the first control terminal VN1 to the gate of the second transistor M2, and further to control the second transistor M2 to be turned on. The turned-on second transistor M2 may supply the high level signal of the first control terminal VN1 to the first sub-node N21, and further the first sub-node N21 is configured with a high level signal, so that the fifth transistor M5 and the sixteenth transistor M16 are both controlled to be turned on. The turned-on fifth transistor M5 may supply the low level signal of the third reference signal terminal VREF3 to the first node N1, and further the first node N1 is configured with a low level signal. The turned-on sixteenth transistor M16 may supply the low level signal of the third reference signal terminal VREF3 to the drive output terminal GOUT, so that the drive output terminal GOUT outputs the low level signal.

At the T20 phase, the first control terminal VN1 is configured with a low level signal, so the first transistor M1 is cut off.

At the input phase T21, IP1=1, CLK=0 and IP2=0.

Since IP2=0, the nineteenth transistor M19 is cut off. Since IP1=1, the eighteenth transistor M18 is turned on, so as to supply the high level signal of the first reference signal terminal VREF1 to the first node N1, and further the first node N1 is configured with a high level signal, so that the third transistor M3, the fourth transistor M4, the tenth transistor M10, the eleventh transistor M11 and the fifteenth transistor M15 are all controlled to be turned on. The turned-on fourth transistor M4 may supply the low level signal of the third reference signal terminal VREF3 to the gate of the second transistor M2, so as to control the second transistor M2 to be cut off. The turned-on third transistor M3 may supply the low level signal of the third reference signal terminal VREF3 to the first sub-node N21, and further the first sub-node N21 is configured with the low level signal, so that the fifth transistor M5 and the sixteenth transistor M16 are both controlled to be cut off. The turned-on eleventh transistor M11 may supply the low level signal of the third reference signal terminal VREF3 to the gate of the ninth transistor M9, so as to control the ninth transistor M9 to be cut off. The turned-on tenth transistor M10 may supply the low level signal of the third reference signal terminal VREF3 to the second sub-node N22, and further the second sub-node N22 is configured with the low level signal, so that the twelfth transistor M12 and the seventeenth transistor M17 are both controlled to be cut off. The turned-on fifteenth transistor M15 may supply the low level signal of the clock signal terminal CLK to the drive output terminal GOUT, so that the drive output terminal GOUT outputs the low level signal.

At the output phase T22, IP1=0, CLK=1 and IP2=0.

Since IP2=0, the nineteenth transistor M19 is cut off. Since IP1=0, the eighteenth transistor M18 is cut off Therefore, the first node N1 is in a floating state. The storage capacitor may enable the first node N1 to maintain the high level signal. The first node N1 is configured with the high level signal, so the third transistor M3, the fourth transistor M4, the tenth transistor M10, the eleventh transistor M11 and the fifteenth transistor M15 are all controlled to be turned on. The turned-on fourth transistor M4 may supply the low level signal of the third reference signal terminal VREF3 to the gate of the second transistor M2, so as to control the second transistor M2 to be cut off. The turned-on third transistor M3 may supply the low level signal of the third reference signal terminal VREF3 to the first sub-node N21, and further the first sub-node N21 is configured with the low level signal, so that the fifth transistor M5 and the sixteenth transistor M16 are both controlled to be cut off. The turned-on eleventh transistor M11 may supply the low level signal of the third reference signal terminal VREF3 to the gate of the ninth transistor M9, so as to control the ninth transistor M9 to be cut off. The turned-on tenth transistor M10 may supply the low level signal of the third reference signal terminal VREF3 to the second sub-node N22, and further the second sub-node N22 is configured with the low level signal, so that the twelfth transistor M12 and the seventeenth transistor M17 are both controlled to be cut off.

The turned-on fifteenth transistor M15 may supply the high level signal of the clock signal terminal CLK to the drive output terminal GOUT. Since the first node N1 is in a floating state, the storage capacitor further pulls up a potential of the first node N1, and further the fifteenth transistor M15 may be turned on as thoroughly as possible, so that the high level signal of the clock signal terminal CLK may be supplied to the drive output terminal GOUT without voltage loss as much as possible, and the drive output terminal GOUT outputs the high level signal.

At the reset phase T23, IP1=0, CLK=0 and IP2=1.

Since IP2=0, the eighteenth transistor M18 is cut off. Since IP2=1, the nineteenth transistor M19 is turned on, so as to supply the low level signal of the second reference signal terminal VREF2 to the first node N1, and further the first node N1 is configured with the low level signal, so that the third transistor M3, the fourth transistor M4, the tenth transistor M10, the eleventh transistor M11 and the fifteenth transistor M15 are all controlled to be cut off. The first sub-node N21 maintains a low level signal, so that the fifth transistor M5 and the sixteenth transistor M16 are both controlled to be cut off.

The eighth transistor M8 is turned on under control of a high level signal of the second control terminal VN2, so as to supply the high level signal of the second control terminal VN2 to the gate of the ninth transistor M9, and further to control the ninth transistor M9 to be turned on. The turned-on ninth transistor M9 may supply the high level signal of the second control terminal VN2 to the second sub-node N22, and further the second sub-node N22 is configured with a high level signal, so that the twelfth transistor M12 and the seventeenth transistor M17 are both controlled to be turned on. The turned-on twelfth transistor M12 may supply the low level signal of the third reference signal terminal VREF3 to the first node N1, and further the first node N1 further is configured with the low level signal. The turned-on seventeenth transistor M17 may supply the low level signal of the third reference signal terminal VREF3 to the drive output terminal GOUT, so that the drive output terminal GOUT outputs the low level signal.

Figure 5:
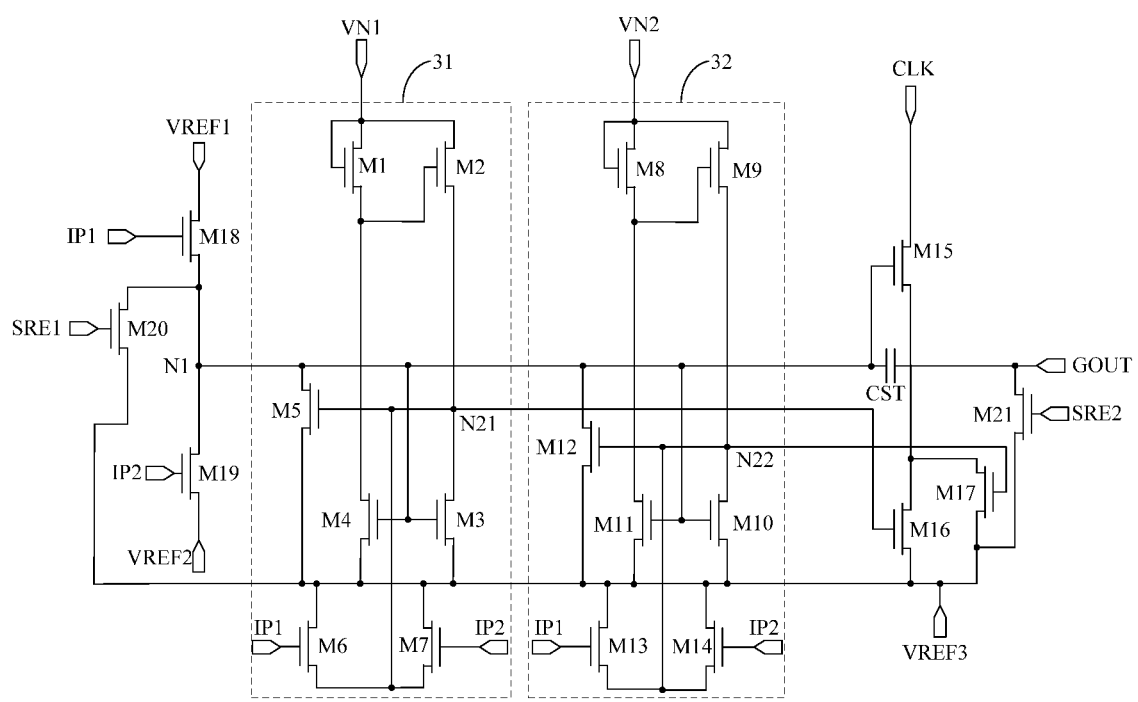
FIG. 5 is some other specific structural schematic diagram of the shift register provided in the embodiments of the present disclosure.

An embodiment of the present disclosure further provides some structural schematic diagrams of the shift register, and modifies the implementation of the above embodiments as shown in FIG. 5. Only differences between the embodiment and the above embodiments will be described below, and similarities will not be repeated herein.

During specific implementation, in the embodiment of the present disclosure, as shown in FIG. 5, the first sub-control circuit 31 may further include: a sixth transistor M6 and a seventh transistor M7; a gate of the sixth transistor M6 is electrically connected to the first input signal terminal IP1, a first electrode of the sixth transistor M6 is electrically connected to the third reference signal terminal VREF3, and a second electrode of the sixth transistor M6 is electrically connected to the first sub-node N21; and a gate of the seventh transistor M7 is electrically connected to the second input signal terminal IP2, a first electrode of the seventh transistor M7 is electrically connected to the third reference signal terminal VREF3, and a second electrode of the seventh transistor M7 is electrically connected to the first sub-node N21.

During specific implementation, in the embodiment of the present disclosure, as shown in FIG. 5, the second sub-control circuit 32 may further include: a thirteenth transistor M13 and a fourteenth transistor M14; a gate of the thirteenth transistor M13 is electrically connected to the first input signal terminal IP1, a first electrode of the thirteenth transistor M13 is electrically connected to the third reference signal terminal VREF3, and a second electrode of the thirteenth transistor M13 is electrically connected to the second sub-node N22; and a gate of the fourteenth transistor M14 is electrically connected to the second input signal terminal IP2, a first electrode of the fourteenth transistor M14 is electrically connected to the third reference signal terminal VREF3, and a second electrode of the fourteenth transistor M14 is electrically connected to the second sub-node N22.

Through analog computation, the sixth transistor M6 added in the first sub-control circuit 31 and the thirteenth transistor M13 added in the second sub-control circuit 32 may rapidly pull down a potential of the second node N2 (that is, the first sub-node N21 and the second sub-node N22) during forward scanning, thereby controlling electric leakage of the fifth transistor M5 and the twelfth transistor M12 and improving signal quality of the first node N1. The seventh transistor M7 added in the first sub-control circuit 31 and the fourteenth transistor M14 added in the second sub-control circuit 32 may rapidly pull down a potential of the second node N2 (that is, the first sub-node N21 and the second sub-node N22) during reverse scanning, thereby controlling the electric leakage of the fifth transistor M5 and the twelfth transistor M12 and improving the signal quality of the first node N1.

Figure 8:
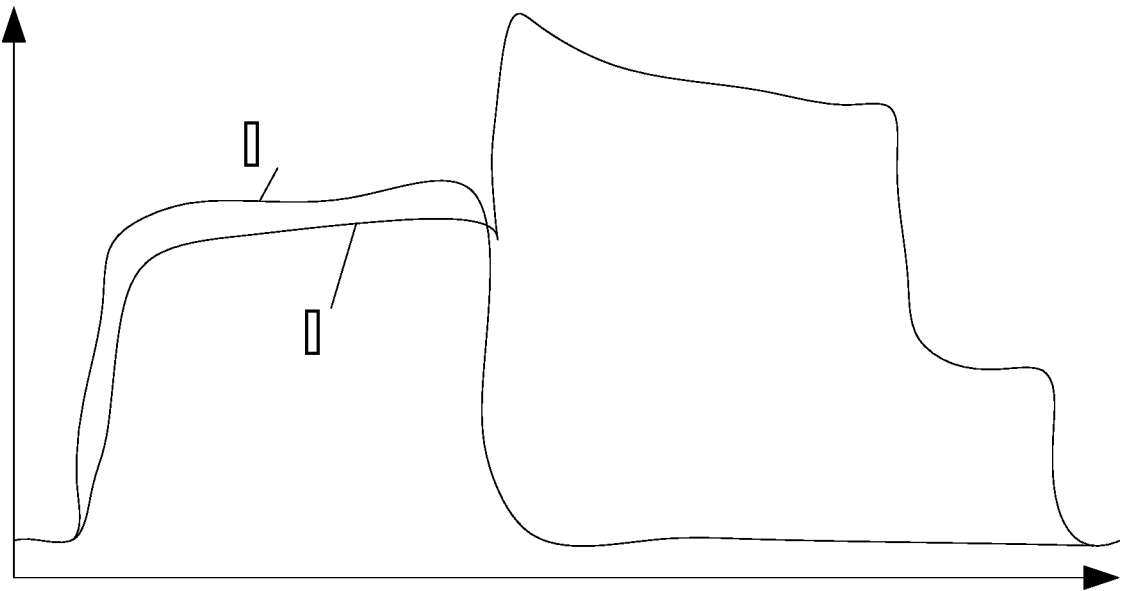
FIG. 8 is a simulated diagram of signals output by a first input signal terminal/second input signal terminal and an eighteenth transistor/a nineteenth transistor in the shift register provided in the embodiments of the present disclosure.
Figure 9:
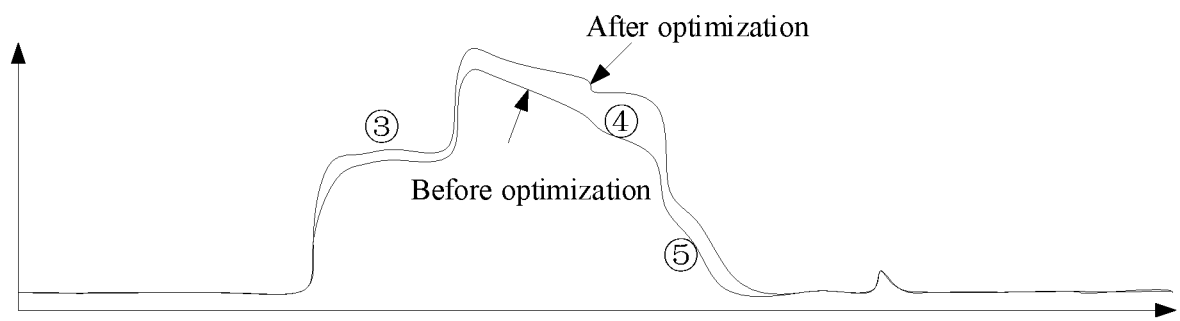
FIG. 9 is a potential simulation diagram of a first node in the shift register provided in the embodiments of the present disclosure.
Figure 10:
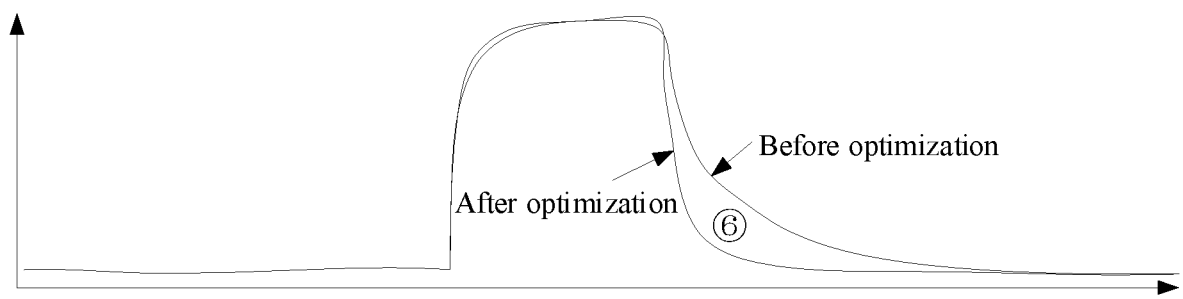
FIG. 10 is a potential simulation diagram of a drive output terminal in the shift register provided in the embodiments of the present disclosure.

FIG. 8 shows signals input by the first input signal terminal IP1 during forward scanning and input by the second input signal terminal IP2 during reverse scanning in the shift register provided in the embodiments of the present disclosure. The signal is a signal ① output by the drive output terminal GOUT of a previous stage of shift register. It may be seen that the signal rises faster and a value of Vmax is higher. FIG. 8 further shows signals ② output from the eighteenth transistor M18 to the first node N1 during forward scanning and output from the nineteenth transistor M19 to the first node N1 during reverse scanning in the shift register provided in the embodiments of the present disclosure. FIG. 9 shows a schematic diagram of potentials of the first node N1 at an input phase ③, an output phase ④ and a reset phase ⑤. It may be seen that compared with a traditional shift register structure (before optimization), a shift register structure (after optimization) provided in the embodiments of the present disclosure may improve signal potential quality of the first node N1. FIG. 10 shows a schematic diagram of a potential of the drive output terminal GOUT. It may be seen that compared with the traditional shift register structure (before optimization), the shift register structure provided in the embodiments of the present disclosure (after optimization) may solve a trailing problem of the drive output terminal GOUT at a reset phase ⑥, occurrence of a bad (horizontal black line) situation may be prevented, signal quality of the drive output terminal GOUT may be ensured, and service life of the shift register may be prolonged to a certain extent. Through a simulation test, it may be seen that the shift register provided in the embodiments of the present disclosure is capable of supporting a higher reliable operating condition (−20° C.-70° C.), so as to solve a problem of high temperature life.

During specific implementation, in the embodiment of the present disclosure, as shown in FIG. 5, the shift register may further include: a twentieth transistor M20, where a gate of the twentieth transistor M20 is electrically connected to a first frame reset signal terminal SRE1, a first electrode of the twentieth transistor M20 is electrically connected to the third reference signal terminal VREF3, and a second electrode of the twentieth transistor M20 is electrically connected to the first node N1.

During specific implementation, in the embodiment of the present disclosure, as shown in FIG. 5, the shift register may further include: a twenty-first transistor M21, where a gate of the twenty-first transistor M21 is electrically connected to a second frame reset signal terminal SRE2, a first electrode of the twenty-first transistor M21 is electrically connected to the third reference signal terminal VREF3, and a second electrode of the twenty-first transistor M21 is electrically connected to the drive output terminal GOUT.

Figure 6:
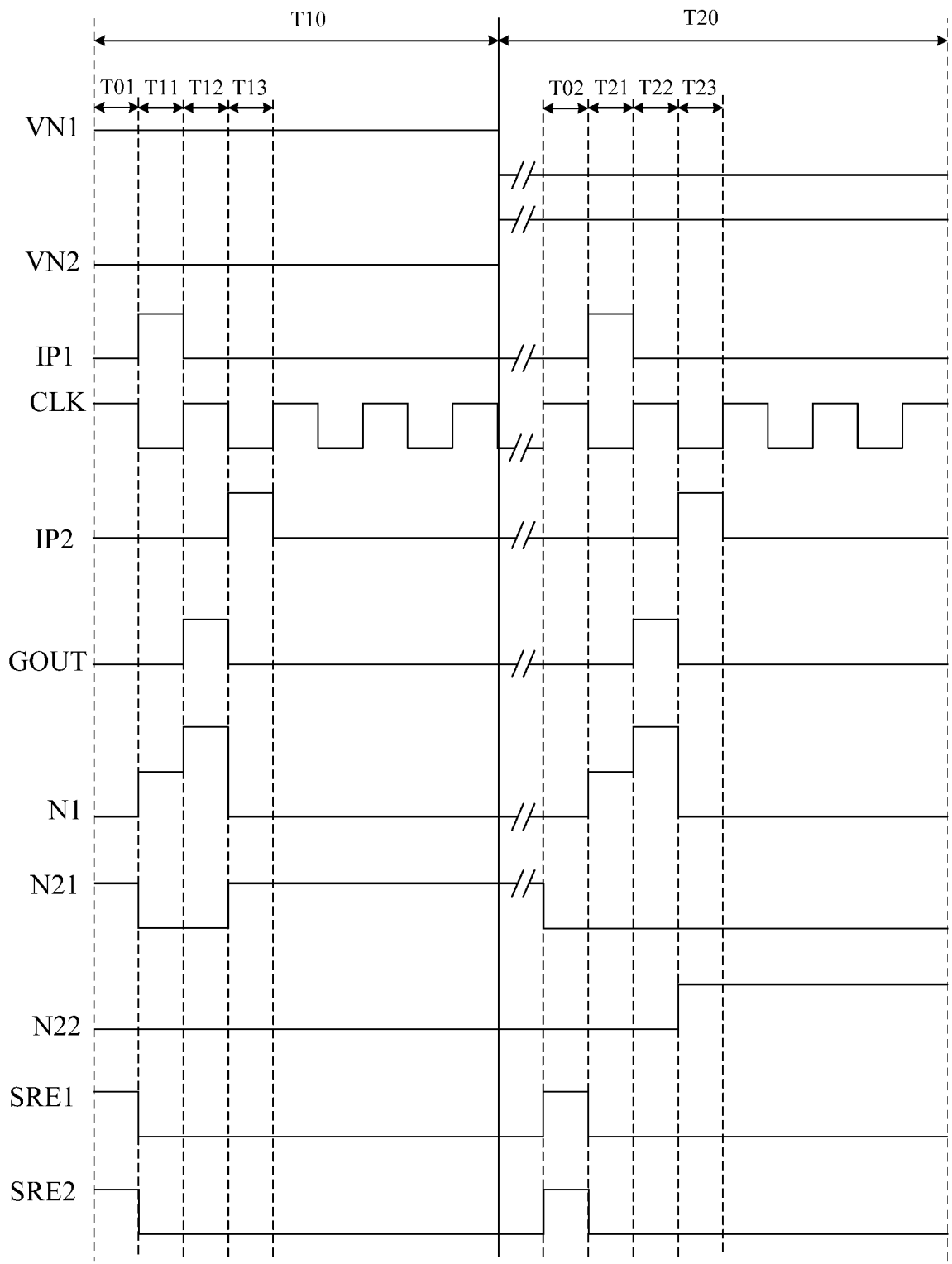
FIG. 6 is some other signal sequence diagram provided in the embodiments of the present disclosure.

A structure of the shift register shown in FIG. 5 is taken as an example below, a signal sequence diagram shown in FIG. 6 is combined, forward scanning is taken as an example, and the work process of the shift register provided in the embodiments of the present disclosure will be described. A work process corresponding to the embodiment is partially consistent with that of the shift register shown in FIG. 3, and only differences of the work processes will be described below.

At the phase T10, before the input phase T11, a frame reset phase T01 may further be included. At the frame reset phase T01, the first frame reset signal terminal SRE1 is configured with a high level signal, the twentieth transistor M20 may be controlled to be turned on, and further the low level signal of the third reference signal terminal VREF3 is supplied to the first node N1, so that the first node N1 is pre-reset, and further noise of the drive output terminal GOUT may be reduced. The second frame reset signal terminal SRE2 is configured with a high level signal, the twenty-first transistor M21 may be controlled to be turned on, and further the low level signal of the third reference signal terminal VREF3 is supplied to the drive output terminal GOUT, so that the drive output terminal GOUT is pre-reset, and further the noise of the drive output terminal GOUT may be reduced. At the input phase T11, the sixth transistor M6 is turned on under control of the high level signal of the first input signal terminal IP1 and further supplies the low level signal of the third reference signal terminal VREF3 to the first sub-node N21, so that the first sub-node N21 may be configured with a low level signal, and further the noise of the drive output terminal GOUT may be reduced. The thirteenth transistor M13 is turned on under control of the high level signal of the first input signal terminal IP1 and further supplies the low level signal of the third reference signal terminal VREF3 to the second sub-node N22, so that the second sub-node N22 may be configured with a low level signal, and further the noise of the drive output terminal GOUT may be reduced. (During reverse scanning, at the input phase T11, the seventh transistor M7 is turned on under control of the high level signal of the second input signal terminal IP2 and further supplies the low level signal of the third reference signal terminal VREF3 to the first sub-node N21, so that the first sub-node N21 may be configured with a level signal, and further the noise of the drive output terminal GOUT may be reduced. The fourteenth transistor M14 is turned on under control of the high level signal of the second input signal terminal IP2 and further supplies the low level signal of the third reference signal terminal VREF3 to the second sub-node N22, so that the second sub-node N22 may be configured with a low level signal, and further the noise of the drive output terminal GOUT may be reduced.)

At the phase T20, before the input phase T21, a frame reset phase T02 may further be included. At the frame reset phase T02, the first frame reset signal terminal SRE1 is configured with a high level signal, the twentieth transistor M20 may be controlled to be turned on, and further the low level signal of the third reference signal terminal VREF3 is supplied to the first node N1, so that the first node N1 is pre-reset, and further noise of the drive output terminal GOUT may be further reduced. The second frame reset signal terminal SRE2 is configured with a high level signal, the twenty-first transistor M21 may be controlled to be turned on, and further the low level signal of the third reference signal terminal VREF3 is supplied to the drive output terminal GOUT, so that the drive output terminal GOUT is pre-reset, and further the noise of the drive output terminal GOUT may be reduced. At the input phase T11, the sixth transistor M6 is turned on under control of the high level signal of the first input signal terminal IP1 and further supplies the low level signal of the third reference signal terminal VREF3 to the first sub-node N21, so that the first sub-node N21 may be configured with a low level signal, and further the noise of the drive output terminal GOUT may be reduced. The thirteenth transistor M13 is turned on under control of the high level signal of the first input signal terminal IP1 and further supplies the low level signal of the third reference signal terminal VREF3 to the second sub-node N22, so that the second sub-node N22 may be configured with a low level signal, and further the noise of the drive output terminal GOUT may be reduced. (During reverse scanning, at the input phase T11, the seventh transistor M7 is turned on under control of the high level signal of the second input signal terminal IP2 and further supplies the low level signal of the third reference signal terminal VREF3 to the first sub-node N21, so that the first sub-node N21 may be configured with a low level signal, and further the noise of the drive output terminal GOUT may be reduced. The fourteenth transistor M14 is turned on under control of the high level signal of the second input signal terminal IP2 and further supplies the low level signal of the third reference signal terminal VREF3 to the second sub-node N22, so that the second sub-node N22 may be configured with a low level signal, and further the noise of the drive output terminal GOUT may be reduced.)

Figure 7:
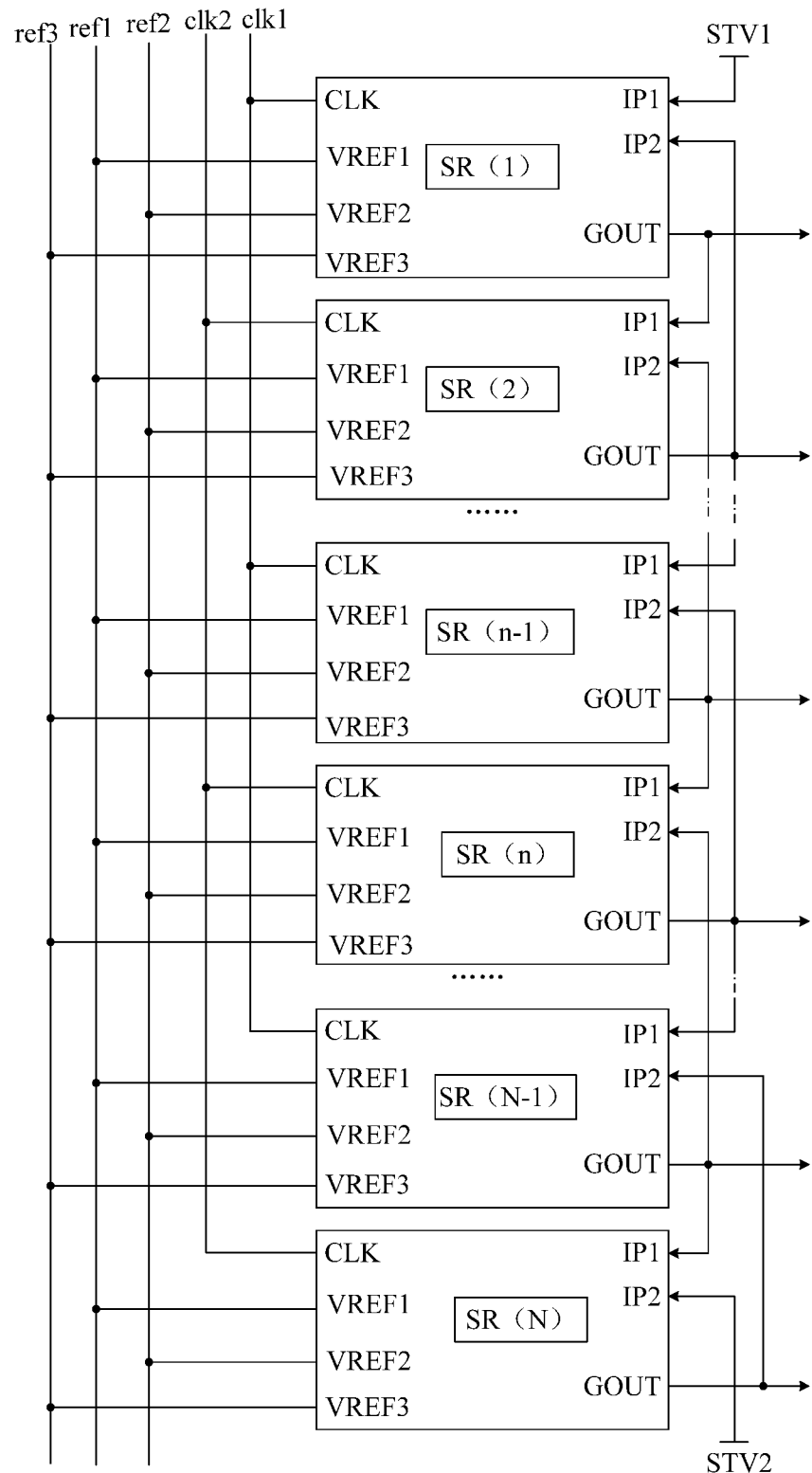
FIG. 7 is a structural schematic diagram of a gate drive circuit provided in the embodiments of the present disclosure.

An embodiment of the present disclosure further provides a gate drive circuit, which includes a plurality of cascaded shift registers provided in the embodiments of the present disclosure: SR(1), SR(2) . . . SR(n−1), SR(n) . . . SR(N−1), SR(N) (N shift registers in total, 1≤n≤N, and n and N are positive integers) as shown in FIG. 7, where a first input signal terminal IP1 of a first stage of shift register SR(1) is electrically connected to a first frame trigger signal terminal STV1, and a second input signal terminal IP2 of a last stage of shift register SR(N) is electrically connected to a second frame trigger signal terminal STV2; and in every two stages of shift registers, a first input signal terminal IP1 of a next level of shift register of SR(n) is electrically connected to a drive output terminal GOUT of a previous stage of shift register SR(n−1), and a second input signal terminal IP2 of the previous stage of shift register SR(n−1) is electrically connected to a drive output terminal GOUT of the next stage of shift register SR(n). It should be noted that in FIG. 7 is illustrated according to the following example that in every adjacent two stages of shift registers, a first input signal terminal IP1 of a next stage of shift register SR(n) is electrically connected to a drive output terminal GOUT of a previous stage of shift register SR(n−1), and a second input signal terminal IP2 of the previous stage of shift register SR(n−1) is electrically connected to a drive output terminal GOUT of the next stage of shift register SR(n). In actual application, every two stages of shift registers may be spaced from each other by one or more shift registers, which is not limited herein.

Specifically, each of the shift registers in the above gate drive circuit is consistent in function and structure with the shift register provided in the embodiments of the present disclosure, which will not be repeated herein. It should be noted that during forward scanning, the first frame trigger signal terminal STV1 is loaded with a frame start signal, and the gate drive circuit starts to sequentially output effective signals from the drive output terminal GOUT of a first stage of shift register SR(1); and during reverse scanning, the second frame trigger signal terminal STV2 is loaded with a frame start signal, and the gate drive circuit starts to sequentially output effective signals from the drive output terminal GOUT of a last stage of shift register SR(n).

During specific implementation, in the gate drive circuit provided in the embodiments of the present disclosure, as shown in FIG. 7, clock signal terminals CLK of odd-numbered stages of shift registers are all electrically connected to the same clock line clk1, and clock signal terminals CLK of even-numbered stages of shift registers are all electrically connected to the same clock line clk2.

During specific implementation, in the gate drive circuit provided in the embodiments of the present disclosure, as shown in FIG. 7, a first reference signal terminal VREF1 of each stage of shift register is electrically connected to the same first reference signal line ref1. A second reference signal terminal VREF2 of each stage of shift register is electrically connected to the same second reference signal line ref2. A third reference signal terminal VREF3 of each stage of shift register is electrically connected to the same third reference signal line ref3. During forward scanning, the first reference signal line ref1 loads a high level signal into a first reference signal terminal VREF1 of each stage of shift register, and the second reference signal line ref2 loads a low level signal into a second reference signal terminal VREF2 of each stage of shift register. During reverse scanning, the first reference signal line ref1 loads a low level signal into a first reference signal terminal VREF1 of each stage of shift register, and the second reference signal line ref2 loads a high level signal into a second reference signal terminal VREF2 of each stage of shift register. During forward and reverse scanning, the third reference signal line ref3 loads a low level signal into a third reference signal terminal VREF3 of each stage of shift register.

During specific implementation, when the shift register includes the twentieth transistor M20, in the gate drive circuit provided in the embodiments of the present disclosure, a first frame reset signal terminal SRE1 of each stage of shift register may be electrically connected to the same first frame reset terminal. In this way, the first node N1 of each stage of shift register may be pre-reset simultaneously.

During specific implementation, when the shift register includes the twenty-first transistor M21, in the gate drive circuit provided in the embodiment of the present disclosure, a second frame reset signal terminal SRE2 of each stage of shift register may be electrically connected to the same second frame reset terminal. In this way, the drive output terminal GOUT of each stage of shift register may be pre-reset simultaneously.

Based on the same inventive concept, an embodiment of the present disclosure further provides a display device, which includes the gate drive circuit provided in the embodiments of the present disclosure. A problem solving principle of the display device is similar to that of the gate drive circuit, so implementation of the display device may be referred to implementation of the gate drive circuit, which will not be repeated herein.

During specific implementation, in the embodiments of the present disclosure, the display device may further include: a first reference signal line, a second reference signal line and a third reference signal line which are arranged in a mutually spaced manner; a first reference terminal electrically connected to the first reference signal line; a second reference terminal electrically connected to the second reference signal line; and a third reference terminal electrically connected to the third reference signal line; where a first reference signal terminal VREF1 of a shift register in the gate drive circuit is electrically connected to the first reference signal line; a second reference signal terminal VREF2 of a shift register in the gate drive circuit is electrically connected to the second reference signal line; and a third reference signal terminal VREF3 of a shift register in the gate drive circuit is electrically connected to the third reference signal line.

During specific implementation, in the embodiment of the present disclosure, the display device may further include: a driver chip; where the driver chip is bonded to the first reference terminal, the second reference terminal and the third reference terminal separately; and the driver chip is configured to load a signal into the first reference signal terminal VREF1 of the shift register in the gate drive circuit through the first reference terminal, load a signal into the second reference signal terminal VREF2 of the shift register in the gate drive circuit through the second reference terminal and load a signal into the third reference terminal VREF3 of the shift register in the gate drive circuit through the third reference terminal.

During specific implementation, in the embodiments of the present disclosure, the display device may be any product or component with a display function, such as a mobile phone, a tablet computer, a television, a display screen, a notebook computer, a digital photo frame and a navigator. Other essential components of the display device should be understood by those of ordinary skill in the art, which will not be repeated herein and should not limit the present disclosure.

According to the shift register, the gate drive circuit and the display device provided in the embodiments of the present disclosure, during forward scanning, the first input circuit may supply the signal of the first reference signal terminal to the first node in response to the signal of the first input signal terminal at the input phase, and the second input circuit may supply the signal of the second reference signal terminal to the first node in response to the signal of the second input signal terminal at the reset phase. During reverse scanning, the second input circuit may supply the signal of the second reference signal terminal to the first node in response to the signal of the second input signal terminal at the input phase, and the first input circuit may supply the signal of the first reference signal terminal to the first node in response to the signal of the first input signal terminal at the reset phase. The control circuit may control the signals of the first node and the second node. The output circuit may supply the signal of the clock signal terminal to the drive output terminal in response to the signal of the first node, and supply the signal of the third reference signal terminal to the drive output terminal in response to the signal of the second node. The first input circuit and the second input circuit are designed in a symmetrical structure, and charge and discharge of the first node may be designed symmetrically during forward and reverse scanning, thereby realizing a function of bidirectional scanning.

Apparently, those skilled in the art may make various modifications and variations to the present disclosure without departing from the spirit and scope of the present disclosure. In this way, if these modifications and variations of the present disclosure fall within the scope of the claims of the present disclosure and their equivalent technologies, the present disclosure is also intended to include these modifications and variations.

What is claimed is:

1. A shift register, comprising:
a first input circuit, configured to supply a signal of a first reference signal terminal to a first node in response to a signal of a first input signal terminal;
a second input circuit, configured to supply a signal of a second reference signal terminal to the first node in response to a signal of a second input signal terminal;
a control circuit, configured to control a signal of the first node and a signal of a second node; and
an output circuit, configured to supply a signal of a clock signal terminal to a drive output terminal in response to the signal of the first node, and to supply a signal of a third reference signal terminal to the drive output terminal in response to the signal of the second node;
wherein the first input signal terminal is loaded with an effective signal at an input phase, and the second input signal terminal is loaded with an effective signal at a reset phase; or
the second input signal terminal is loaded with an effective signal at an input phase, and the first input signal terminal is loaded with an effective signal at a reset phase.

2. The shift register according to claim 1, wherein the second node comprises: a first sub-node and a second sub-node;
the control circuit comprises a first sub-control circuit and a second sub-control circuit, the first sub-control circuit is configured to control the signal of the first node and a signal of the first sub-node, and the second sub-control circuit is configured to control the signal of the first node and a signal of the second sub-node; and
the output circuit is configured to supply the signal of the third reference signal terminal to the drive output terminal in response to the signal of the first sub-node, and to supply the signal of the third reference signal terminal to the drive output terminal in response to the signal of the second sub-node.

3. The shift register according to claim 2, wherein the first sub-control circuit comprises: a first transistor, a second transistor, a third transistor, a fourth transistor and a fifth transistor;
a gate and a first electrode of the first transistor are both electrically connected to a first control terminal, and a second electrode of the first transistor is electrically connected to a gate of the second transistor;
a first electrode of the second transistor is electrically connected to the first control terminal, and a second electrode of the second transistor is electrically connected to the first sub-node;
a gate of the third transistor is electrically connected to the first node, a first electrode of the third transistor is electrically connected to the third reference signal terminal, and a second electrode of the third transistor is electrically connected to the first sub-node;
a gate of the fourth transistor is electrically connected to the first node, a first electrode of the fourth transistor is electrically connected to the third reference signal terminal, and a second electrode of the fourth transistor is electrically connected to the gate of the second transistor; and
a gate of the fifth transistor is electrically connected to the first sub-node, a first electrode of the fifth transistor is electrically connected to the third reference signal terminal, and a second electrode of the fifth transistor is electrically connected to the first node.

4. The shift register according to claim 3, wherein the first sub-control circuit further comprises: a sixth transistor and a seventh transistor;
a gate of the sixth transistor is electrically connected to the first input signal terminal, a first electrode of the sixth transistor is electrically connected to the third reference signal terminal, and a second electrode of the sixth transistor is electrically connected to the first sub-node; and
a gate of the seventh transistor is electrically connected to the second input signal terminal, a first electrode of the seventh transistor is electrically connected to the third reference signal terminal, and a second electrode of the seventh transistor is electrically connected to the first sub-node.

5. The shift register according to claim 2, wherein the second sub-control circuit comprises: an eighth transistor, a ninth transistor, a tenth transistor, an eleventh transistor and a twelfth transistor;
a gate and a first electrode of the eighth transistor are both electrically connected to a second control terminal, and a second electrode of the eighth transistor is electrically connected to a gate of the ninth transistor;
a first electrode of the ninth transistor is electrically connected to the second control terminal, and a second electrode of the ninth transistor is electrically connected to the second sub-node;
a gate of the tenth transistor is electrically connected to the first node, a first electrode of the tenth transistor is electrically connected to the third reference signal terminal, and a second electrode of the tenth transistor is electrically connected to the second sub-node;
a gate of the eleventh transistor is electrically connected to the first node, a first electrode of the eleventh transistor is electrically connected to the third reference signal terminal, and a second electrode of the eleventh transistor is electrically connected to the gate of the ninth transistor; and
a gate of the twelfth transistor is electrically connected to the second sub-node, a first electrode of the twelfth transistor is electrically connected to the third reference signal terminal, and a second electrode of the twelfth transistor is electrically connected to the first node.

6. The shift register according to claim 5, wherein the second sub-control circuit further comprises: a thirteenth transistor and a fourteenth transistor;
a gate of the thirteenth transistor is electrically connected to the first input signal terminal, a first electrode of the thirteenth transistor is electrically connected to the third reference signal terminal, and a second electrode of the thirteenth transistor is electrically connected to the second sub-node; and
a gate of the fourteenth transistor is electrically connected to the second input signal terminal, a first electrode of the fourteenth transistor is electrically connected to the third reference signal terminal, and a second electrode of the fourteenth transistor is electrically connected to the second sub-node.

7. The shift register according to claim 2, wherein the output circuit comprises: a storage capacitor, a fifteenth transistor, a sixteenth transistor and a seventeenth transistor;
a gate of the fifteenth transistor is electrically connected to the first node, a first electrode of the fifteenth transistor is electrically connected to the clock signal terminal, and a second electrode of the fifteenth transistor is electrically connected to the drive output terminal;

a gate of the sixteenth transistor is electrically connected to the first sub-node, a first electrode of the sixteenth transistor is electrically connected to the third reference signal terminal, and a second electrode of the sixteenth transistor is electrically connected to the drive output terminal;

a gate of the seventeenth transistor is electrically connected to the second sub-node, a first electrode of the seventeenth transistor is electrically connected to the third reference signal terminal, and a second electrode of the seventeenth transistor is electrically connected to the drive output terminal; and a first electrode plate of the storage capacitor is electrically connected to the first node, and a second electrode plate of the storage capacitor is electrically connected to the drive output terminal.

8. The shift register according to claim 1, wherein the first input circuit comprises an eighteenth transistor; and a gate of the eighteenth transistor is electrically connected to the first input signal terminal, a first electrode of the eighteenth transistor is electrically connected to the first reference signal terminal, and a second electrode of the eighteenth transistor is electrically connected to the first node.

9. The shift register according to claim 1, wherein the second input circuit comprises: a nineteenth transistor; and a gate of the nineteenth transistor is electrically connected to the second input signal terminal, a first electrode of the nineteenth transistor is electrically connected to the second reference signal terminal, and a second electrode of the nineteenth transistor is electrically connected to the first node.

10. The shift register according to claim 1, further comprising: a twentieth transistor;

wherein a gate of the twentieth transistor is electrically connected to a first frame reset signal terminal, a first electrode of the twentieth transistor is electrically connected to the third reference signal terminal, and a second electrode of the twentieth transistor is electrically connected to the first node.

11. The shift register according to claim 1, further comprising: a twenty-first transistor;

wherein a gate of the twenty-first transistor is electrically connected to a second frame reset signal terminal, a first electrode of the twenty-first transistor is electrically connected to the third reference signal terminal, and a second electrode of the twenty-first transistor is electrically connected to the drive output terminal.

12. A gate drive circuit, comprising a plurality of cascaded shift registers according to claim 1;

wherein the first input signal terminal of a first stage of shift register is electrically connected to a first frame trigger signal terminal, and the second input signal terminal of a last stage of shift register is electrically connected to a second frame trigger signal terminal; and in every two stages of shift registers, the first input signal terminal of a next stage of shift register is electrically connected to the drive output terminal of a previous stage of shift register, and the second input signal terminal of the previous stage of shift register is electrically connected to the drive output terminal of the next stage of shift register.

13. A display device, comprising the gate drive circuit according to claim 12.

14. The display device according to claim 13, further comprising:

a first reference signal line, a second reference signal line and a third reference signal line which are arranged in a mutually spaced manner;

a first reference terminal electrically connected to the first reference signal line;

a second reference terminal electrically connected to the second reference signal line; and a third reference terminal electrically connected to the third reference signal line;

wherein the first reference signal terminal of the shift register in the gate drive circuit is electrically connected to the first reference signal line;

the second reference signal terminal of the shift register in the gate drive circuit is electrically connected to the second reference signal line; and the third reference signal terminal of the shift register in the gate drive circuit is electrically connected to the third reference signal line.

15. The display device according to claim 14, further comprising: a driver chip;

wherein the driver chip is bonded to the first reference terminal, the second reference terminal and the third reference terminal separately; and the driver chip is configured to load a signal into the first reference signal terminal of the shift register in the gate drive circuit through the first reference terminal, to load a signal into the second reference signal terminal of the shift register in the gate drive circuit through the second reference terminal and to load a signal into the third reference signal terminal of the shift register in the gate drive circuit through the third reference terminal.

* * * * *